US006465154B1

(12) United States Patent
Fromson et al.

(10) Patent No.: US 6,465,154 B1
(45) Date of Patent: Oct. 15, 2002

(54) WEB FED EXTERNAL DRUM PRINTING PLATE IMAGING

(75) Inventors: Howard A. Fromson, 43 Main St., Stonington, CT (US) 06378; William J. Rozell, Vernon, CT (US)

(73) Assignee: Howard A. Fromson, Stonington, CT (US)

( * ) Notice: Subject to any disclaimer, the term of this patent is extended or adjusted under 35 U.S.C. 154(b) by 169 days.

(21) Appl. No.: 09/691,448

(22) Filed: Oct. 17, 2000

(51) Int. Cl.[7] .................................................. G03F 9/00

(52) U.S. Cl. ..................... 430/302; 101/141; 101/463.1

(58) Field of Search .......................... 430/302; 101/141, 101/212, 216, 219, 224, 225, 226, 227, 228, 463.1

(56) References Cited

U.S. PATENT DOCUMENTS 3,592,091 A * 7/1971 Ottavan ........................... 83/6
4,177,730 A * 12/1979 Schriber et al. ............ 101/248
4,333,153 A * 6/1982 Mletzko et al. ............. 364/523
4,587,897 A * 5/1986 Fischer ........................ 101/137
5,355,795 A * 10/1994 Moss et al. ................. 101/141
5,440,984 A * 8/1995 Becker ..................... 101/415.1
5,578,824 A * 11/1996 Koguchi et al. ............ 250/318
5,620,819 A * 4/1997 Conforti et al. .............. 430/14
5,819,661 A * 10/1998 Lewis et al. ................ 101/467
5,916,403 A * 6/1999 Cushner et al. ........ 156/244.13

* cited by examiner

*Primary Examiner*—Janet Baxter
*Assistant Examiner*—Barbara Gilmore
(74) *Attorney, Agent, or Firm*—Alix, Yale & Ristas, LLP

(57) ABSTRACT

An elongated web of lithographic printing plate stock is intermittently fed to the drum of an external drum imaging device. The web is then cut to form the trailing end of an individual printing plate either before or after the leading end is clamped to the drum. The drum is then rotated such that the plate is wrapped around the drum and the trailing end is clamped to the drum.

6 Claims, 2 Drawing Sheets

WEB FED EXTERNAL DRUM PRINTING PLATE IMAGING

BACKGROUND OF THE INVENTION

The present invention relates to printing plate imaging and particularly to the feeding of an external drum imager with plates directly from a web of printing plate stock.

External drum printing plate imagers have a drum with clamps extending axially along the surface of the drum with one clamp for the leading end of a printing plate and another clamp appropriately spaced for the trailing end of the plate. The printing plate is imaged by clamping it onto the drum and then rotating the drum in the imaging apparatus with the imaging radiation scanning the plate.

In the conventional operation of an external drum imager, there is a stack of printing plates which have been pre-cut to the appropriate size usually with interleaving sheets of paper between adjacent plates to protect the imageable coating on the front faces of the plates from contact with the back faces of the adjacent plates. With automatic operation, each plate is picked up from the stack, usually by vacuum fingers, and loaded into the clamps on the drum. Provision must also be made for removing and disposing of the interleaving paper. This loading process is then repeated for each plate to be imaged.

SUMMARY OF THE INVENTION

The object of the present invention is to simplify the loading of printing plates onto an external drum imager. The invention involves the feeding of a web of printing plate stock to the drum and then cutting the web to form an individual plate of the appropriate length. The drum is then rotated so that the cut plate with the leading end clamped to the drum is wrapped around the drum and the trailing end clamped. The plate is then ready for imaging and unloading from the drum in a conventional manner.

DESCRIPTION OF THE PREFERRED EMBODIMENT

Figure 1:
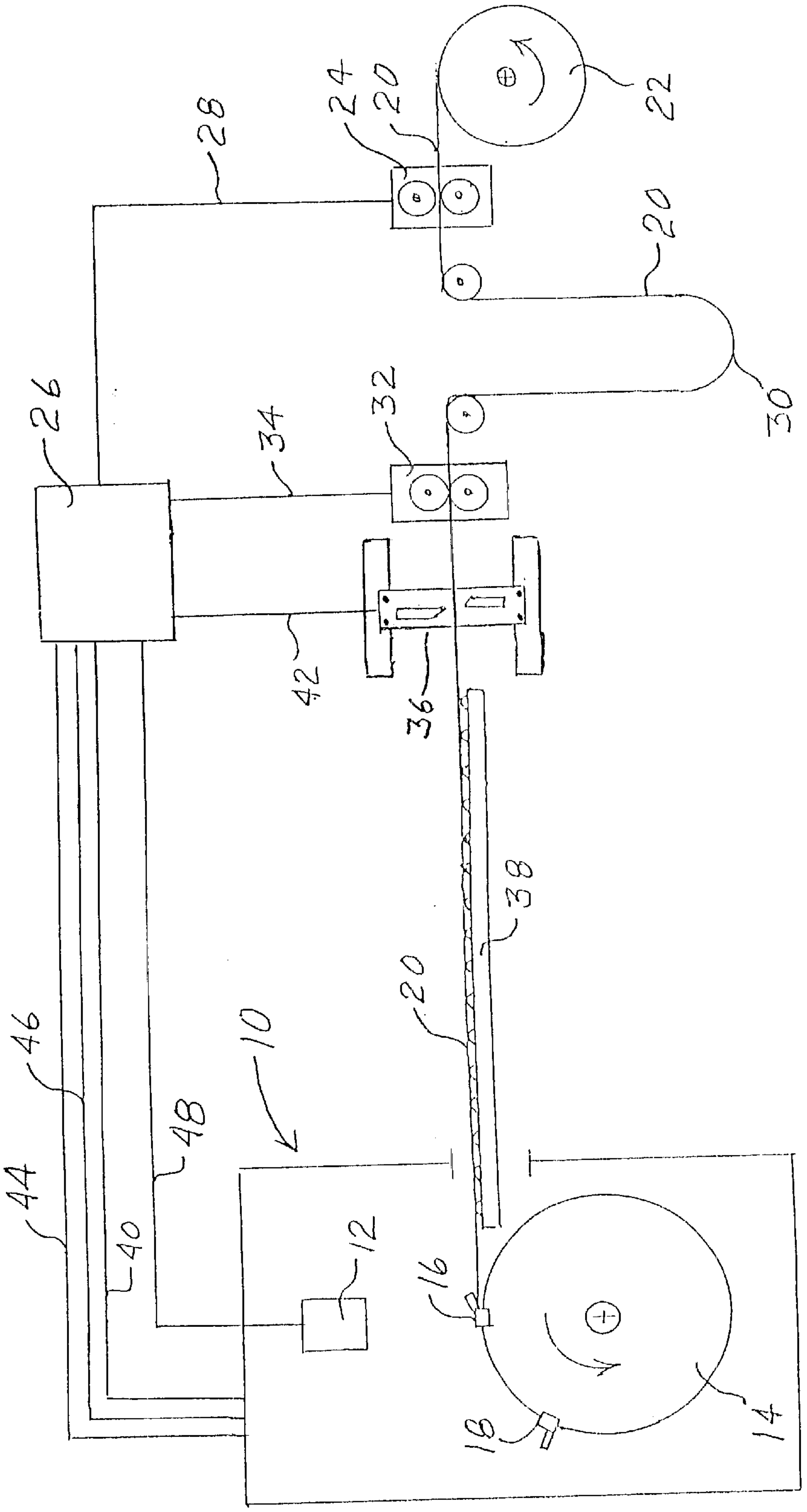
FIG. 1 is a schematic representation of the invention illustrating a printing plate web processing line feeding to the imaging drum of an external drum imager.

In FIG. 1 of the drawings, an external drum imaging apparatus is represented at 10 including an imaging head 12 and the drum 14. The drum includes a printing plate leading end clamp 16 and a trailing end clamp 18. The clamps 16 and 18 are electrically operated to clamp a printing plate onto the external surface of the drum 14. Preferably, the clamp 18 may be moved circumferentially around the drum to accommodate various length plates. Such external drum imagers are conventional and commercially available such as from CreoScitex Inc. The operation of the clamps in the context of the present invention will be discussed later.

In the present invention as illustrated in FIG. 1, a web 20 of printing plate stock is provided from the roll 22. The web is preferably continuously fed from the roll 22 by the driven feed rolls 24. These feed rolls are controlled from the control unit 26 through line 28. Optionally, a web of interleaving paper is wound on the roll 22 with the printing plate stock for protection and it is merely discarded as the web is unrolled. The web 20 then forms a take-up-loop 30 to compensate for the continuous web feed into the loop and the intermittent web feed downstream from the loop as will be explained.

The web 20 is pulled from the loop 30 by the feed roller device 32 which intermittently or periodically feeds the web 20 a precise distance or length corresponding to the particular plate length desired. This feed roller device 32 is also controlled from the control unit 26 through line 34. The web 20 is fed from the feed roller device 32 through the shear 36 and over the plate conveyor 38 into the external drum imaging device 10. The preferred arrangement feeds the web into the leading end clamp 16 before the web is cut but the web may also be cut first and then the cut plate fed some additional distance into the clamp as will be described later. When the drum 14 of the external drum imaging device 10 is at rest and in the loading position, the leading end clamp 16 and the plate conveyor 38 are aligned such that the leading end of the web feeds directly into the leading end clamp.

In the preferred arrangement just mentioned, the leading end of the plate is clamped at 16 which fixes the position of the leading end. The clamp 16 is actuated by the control unit 26 through line 40 so that it closes when the web has been fed into the clamp. The shear 36 is then actuated by the control unit 26 through line 42 to cut a plate to length from the web. For longer plates, the drum 14 can be rotated in coordination with the continued operation of the feed roller device 32 until the desired plate length has been fed and cut from the web by the shear 36. When the web has been cut, the control unit 26 through line 44 rotates the drum 14 to bring the trailing end of the cut plate into position in the trailing end clamp 18 which is then actuated by the control unit 26 such as through line 46 to close the clamp. The trailing end clamp 18 is moveable around the circumference of the drum 14 so that it can be adjusted to accommodate different length plates as is common in such imagers. The plate is now ready to image and the drum is again rotated but in an imaging mode and the imaging head 12 is actuated through line 48. After imaging, the imaged plate is released from the drum 14 and fed out of the imaging apparatus 10 in a conventional manner. The system is then ready to repeat the whole process.

Figure 2:
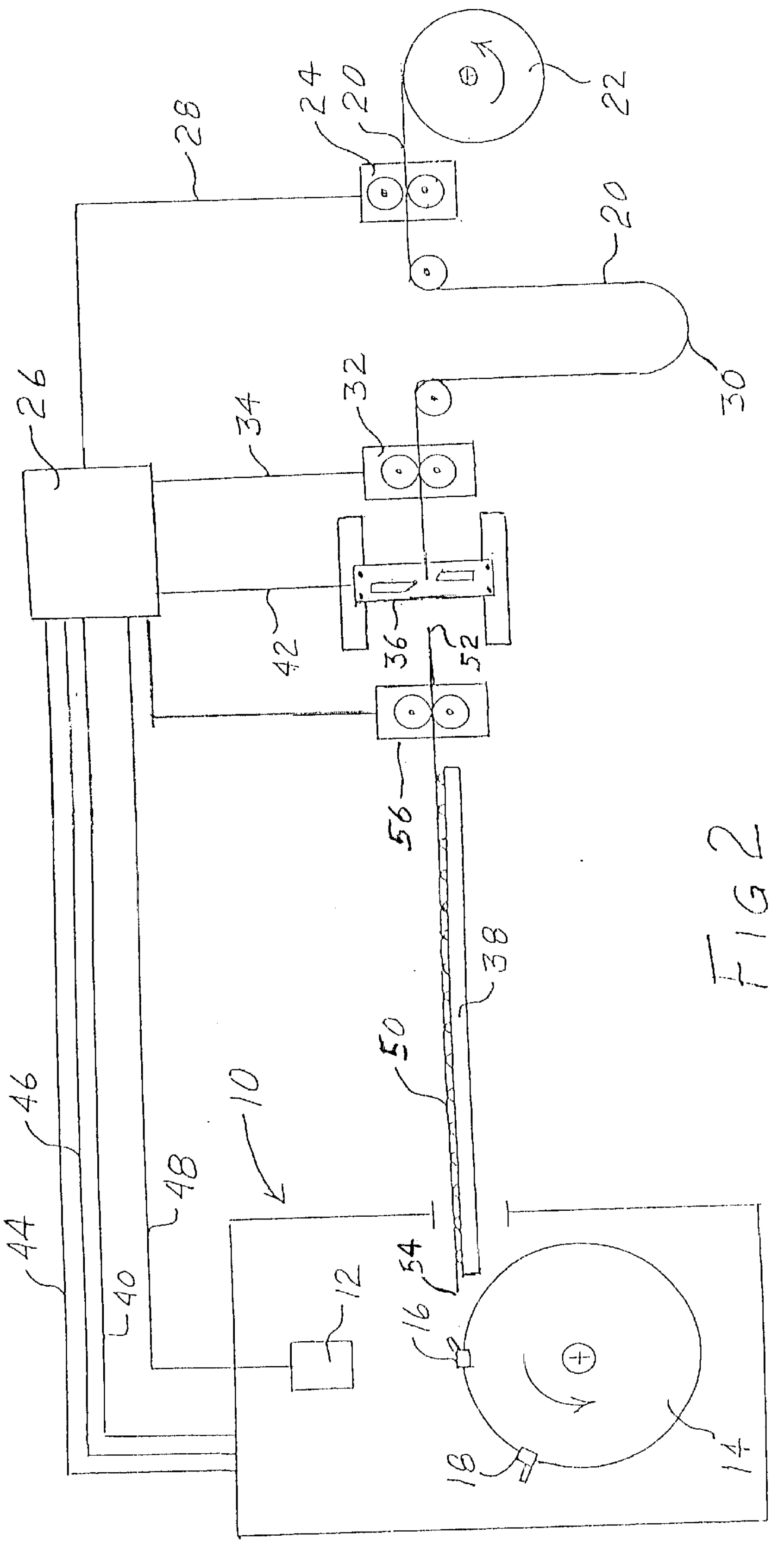
FIG. 2 is a schematic representation similar to FIG. 1 but illustrating another embodiment.

As mentioned, an alternate arrangement is for the web to be cut prior to feeding the leading end of the web into the leading end clamp 16. This arrangement is shown in FIG. 2 which illustrates an individual plate 50 which has already been cut from the web 20 to form the trailing end 52 before the leading end 54 is positioned in the clamp 16. This individual plate 50 is fed by the feed roller device 56 into the clamp after which the process continues as previously described.

What is claimed is:

1. A method of imaging lithographic printing plates comprising the steps of:

a. feeding an elongated web of printing plate stock through a shear and feeding the leading end of said web to the drum of an external drum printing plate imager;

b. clamping said leading end to said drum and cutting said web with said shear to form a trailing end of an individual printing plate of a desired length;

c. rotating said drum and thereby wrapping said individual printing plate around said drum;

d. clamping said trailing end of said individual printing plate to said drum; and e. imaging said printing plate.

2. A method as recited in claim 1 comprising cutting said web prior to clamping said leading end.

3. A method as recited in claim 2 and further including the step of feeding said cut individual printing plate an additional distance such that said leading end is fed into position to be clamped.

4. A method as recited in claim 3 and further including the step of adjusting the position of said shear from said leading end a distance corresponding to said desired length of said individual printing plate.

5. A method as recited in claim 1 wherein said leading end is fed into position to be clamped and comprising clamping said leading end prior to cutting said web.

6. A method as recited in claim 1 wherein said step of feeding said elongated web comprises intermittently feeding said elongated web said desired length of said individual printing plate.

* * * * *